United States Patent [19]

Noguchi

[11] Patent Number: 5,068,257

[45] Date of Patent: Nov. 26, 1991

[54] RESIN COMPOSITION CURABLE WITH AN ACTIVE ENERGY RAY CONTAINING HALF-ESTERIFICATED EPOXY RESIN AND MONOMER HAVING ETHYLENICALLY UNSATURATED BOND

[75] Inventor: Hiromichi Noguchi, Atsugi, Japan

[73] Assignee: Canon Kabushiki Kaisha, Tokyo, Japan

[21] Appl. No.: 244,347

[22] Filed: Sep. 15, 1988

[30] Foreign Application Priority Data

Sep. 16, 1987 [JP] Japan .................................. 62-229492
Jun. 29, 1988 [JP] Japan .................................. 63-159078

[51] Int. Cl.$^5$ ...................... C08L 51/00; C08L 47/00; C08L 33/04; C08G 63/48
[52] U.S. Cl. ...................................... 522/31; 522/102; 522/109; 525/65; 525/77; 525/84; 525/85; 525/75
[58] Field of Search .................. 522/31, 102, 109; 525/65, 80, 84, 85, 77, 75, 108, 190

[56] References Cited

U.S. PATENT DOCUMENTS 4,688,054 8/1987 Inamoto et al. ...................... 522/102

FOREIGN PATENT DOCUMENTS 0206086 12/1986 European Pat. Off. ............. 522/102
3620254 12/1986 Fed. Rep. of Germany ...... 522/102

*Primary Examiner*—Marion E. McCamish
*Assistant Examiner*—Susan Berman
*Attorney, Agent, or Firm*—Fitzpatrick, Cella, Harper & Scinto

[57] ABSTRACT

An improved active energy ray-curing resin composition comprising (i) a graft copolymerized polymer having a number average molecular weight of 5,000 or more and a weight average molecular weight of 50,000 or less: (ii) a linear polymer having a number average molecular weight of 5,000 or more and a weight average molecular weight of 350,000 or less and having a glass transition temperature of 60° C. or more: (iii) a half-esterificated epoxy resin: (iv) a monomer having an ethylenically unsaturated bond: and (v) a polymerization initiator capable of generating a Lewis acid by irradiation of an active energy ray.

The resin composition can be desirably cured with an active energy ray such as ultraviolet ray or electron beam and it is capable of being laminated in a desired pattern on a copper-coated laminate for use as a printed board or on a plate of metal, glass, ceramics or plastic.

7 Claims, No Drawings

RESIN COMPOSITION CURABLE WITH AN ACTIVE ENERGY RAY CONTAINING HALF-ESTERIFICATED EPOXY RESIN AND MONOMER HAVING ETHYLENICALLY UNSATURATED BOND

FIELD OF THE INVENTION

This invention relates to a resin composition curable with an active energy ray such as ultraviolet ray or electron beam. More particularly, it relates to an improved resin composition curable with said active energy ray which is capable of being laminated in a desired pattern on a copper-coated laminate for use as a printed board or on a plate of metal, glass, ceramics or plastic.

BACKGROUND OF THE INVENTION

In recent years, there have been often used various resin compositions curable with an active energy ray in coatings or inks, or as a sealing material, as a resist material, as a material for forming a protective film or as a material for forming a pattern. As such resin compositions, for use in forming a protective film for printed wiring board or for use as a resist material for forming a wiring pattern therefor, there are known, for example, a dry film resist containing a high molecular material capable of forming a film under the trade name of RISTON (produced by Du Pont Japan Ltd.) and a thick film liquid resist according to photographic method under the trade name of PROBIMER (produced by Ciba Geigy Co.).

These known resin compositions comprise mainly (a) high molecular materials contributing to formation of a film or a dry coating and (b) a material curable with an active energy ray. And for these resin compositions, their adhesiveness with a substrate, their developing properties for the formation of a pattern, their durability, painting property and drying property as a paint film are varied depending upon the kinds and the molecular structures of said high molecular materials (a). Therefore, when such resin composition is used aiming at providing the above properties as desired, the kinds of the high molecular materials (a) and the molecular design among the components are properly determined so as to meet the requirements.

However, any of the known resin compositions curable with an active energy is still not sufficient in view of the adhesiveness with various substrates even in the case where it is so designed in the above way.

In order to solve this problem, there have been made proposals to add an auxiliary capable of forming a complex with a metal such as a specific heterocyclic compound or a coupling agent to such resin composition, whereby improving its adhesiveness with a metallic substrate as disclosed in Japanese Laid open Patent Applications No. 5934/1976 and No. 24035/1983.

However, there is still an unsolved problem in the case of any of these proposals, that the additive will cause oxidation or corrosion on the resin composition after the lapse of time.

Other than the above proposals, there has been proposed a high molecular material comprising a graft copolymerized polymer having polar groups on its graft chains aiming at obtaining a cured composition exhibiting a sufficient adhesiveness with a substrate without addition of such additive as mentioned above by Japanese Laid-open Patent Application No. 283645/1986.

The resin composition curable with an active energy ray containing said high molecular material to be provided by this publication is such that it makes it possible to realize an improvement in the adhesiveness of the resulting paint film with a substrate and also in its durability without using such additive as mentioned above. However, even for such resin composition as described in the above publication, there still remains the unsolved problem of how to determine the molecular structures for the high molecular weight materials to be used in preparing resins having the desired properties. In fact, in general, it is technically difficult to synthesize a desirable graft copolymerized polymer so that it has a predetermined molecular weight and a predetermined content for the graft chains and it has a desired weight average molecular weight in the range from 50,000 to 350,000.

In order to provide desired enhancement in the developing properties upon formation of a pattern, in other words, in the dissolving rate of unpolymerized part, the swelling of polymerized part, the sensitivity as a result of these factors, the sharpness of the resulting pattern and the controlling ability of the resolution, it is necessary for the number average molecular weight of the high molecular material involved to be not excessively small. In the case of a graft copolymerized polymer, to connect a plurality of graft chains having a length sufficient enough to provide an effective adhesiveness with its trunk chain of a relatively large molecular weight to thereby make the resulting graft copolymerized polymer to have a desired number average molecular weight is generally recognized as being difficult because of steric hindrance in this technical field.

In the case where the number average molecular weight of the high molecular material involved is excessively small, when a pattern is formed using such high molecular material, there are limits for the developing properties, that is, the dissolving rate of unpolymerized part, the swelling of polymerized part, the sensitivity as a result of these factors, the sharpness of the resulting pattern and the controlling allowance of the resolution.

SUMMARY OF THE INVENTION

This invention has been accomplished in view of the problems as described above and an object of this invention is to provide an improved resin composition curable with an active energy ray such as ultraviolet ray or electron beam which is capable of being laminated in a desired pattern on a copper-coated laminate for use as a printed board or on a plate of metal, glass, ceramics or plastic.

Another object of this invention is to provide an improved resin composition curable with an active energy ray which exhibits an excellent adhesiveness with a substrate without addition of any auxiliary.

A further object of this invention is to provide an improved resin composition curable with an active energy ray which exhibits excellent developing properties upon formation of a pattern.

A still further object of this invention is to provide an improved resin composition curable with an active energy ray which may be easily controlled so as to exhibit desired properties upon application purposes.

DETAILED DESCRIPTION OF THE INVENTION

The resin composition curable with an active energy ray to attain the above objects of this invention is one that comprises:

(i) a graft copolymerized polymer having a number average molecular weight of 5,000 or more and a weight average molecular weight of 50,000 or less which comprises a trunk chain composed mainly of structural units derived from at least one monomer (hereinafter referred to as "monomer A") selected from the group consisting of alkyl methacrylates, acrylonitrile and styrene and has graft chains having structural units derived from at least one monomer (hereinafter referred to as "monomer B") selected from the group consisting of the monomers represented by the following formula I and other monomers presented by the formula II:

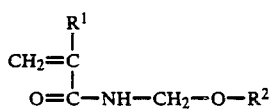

(I)

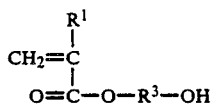

(II)

(wherein $R^1$ is hydrogen or an alkyl or hydroxyalkyl group having 1 to 3 carbon atoms, $R^2$ is hydrogen or an alkyl or acyl group having 1 to 4 carbon atoms which may have hydroxy group, $R^3$ is an alkyl group having 2 to 6 carbon atoms, a halogen-substituted alkyl group having 2 to 6 carbon atoms, an alkylether group represented by the formula:

(wherein $2 \leq m+n \leq 6$, $n \neq 0$ and $m \neq 0$), or a phenylalkyl group represented by the formula:

(wherein $2 \leq m+n \leq 4$, or the case where $n=0$ or $m=0$ is contained), added to said trunk chain;

(ii) a linear polymer having a number average molecular weight of 50,000 or more and a weight average molecular weight of 350,000 or less and having a glass transition temperature of 60° C. or more which comprises structural units derived from at least one monomer (hereinafter referred to as "monomer C") selected from the group consisting of methyl methacrylate, ethyl methacrylate, isobutyl methacrylate, t-butyl methacrylate, benzyl methacrylate, acrylonitrile, isobornyl methacrylate, isobornyl acrylate, tricyclodecaneacrylate, tricyclodecane methacrylate, tricyclodecaneoxyethyl methacrylate, styrene, dimethylaminoethyl methacrylate and cyclohexyl methacrylate and other structural units derived from at least one monomer (monomer B) selected from the group consisting of the monomers represented by said formula (I) and the monomers represented by said formula (II);

(iii) an epoxy resin comprising at least one compound having two or more epoxy groups in one molecule in which part of the epoxy groups being esterificated with an unsaturated carboxylic acid;

(iv) a monomer having an ethylenically unsaturated bond; and (v) a polymerization initiator capable of generating a Lewis acid by irradiation of an active energy ray.

In constituting the above graft copolymerized copolymer (i), specific examples of the monomers to be used for constitution of the trunk chain are such that the main component comprises one or more of alkyl methacrylate, acrylonitrile and styrene as described above. As for the monomers to be used for constitution of the graft chain, in addition to the monomer selected from those represented the foregoing formulas I and II, it is possible to together use a polar monomer selected from the group consisting of acrylic monomers containing amino group or alkylamino group, acrylic or vinyl monomers containing carboxyl group, N-vinylpyrrolidone and its derivatives, and vinylpyridine and its derivatives, in case where necessary. In addition, it is possible to use a hydrophobic monomer as the component of the copolymerization in an amount of about 25 mol % or less.

The above graft copolymerized polymer (i) to be used in the composition of this invention can be prepared according to the known methods, specifically by various methods as disclosed in "Base and Application of Polymer Alloy" p.10-35 (edited by Polymer Society of Japan, published by Tokyo Kagaku Dojin K.K., 1981). Examples of those methods include (1) the chain transfer method, (2) the method by use of radiation, (3) the oxidation polymerization method, (4) the ion graft polymerization method and (5) macromonomer method.

In accordance with any of these methods, the above graft copolymerized polymer (i) can be properly prepared using the foregoing monomers A and B under proper polymerization conditions which make it possible to obtain a desired graft copolymerized polymer having a number average molecular weight of 5,000 or more and a weight average molecular weight of 50,000 or less.

Among the above methods of (1) to (5), the methods of (4) and (5) are preferred since the lengths of the graft chains may be easily uniformed. And, the macromonomer method of (5) is most preferred in view that it is advantageous in design of materials.

The foregoing linear polymer (ii) may be properly prepared in accordance with the conventional polymerization method using the foregoing monomer C as the main component and also using the foregoing monomer B under properly selected polymerization conditions which permit production of a linear polymer having a number average molecular weight of 50,000 or more and a weight average molecular weight of 350,000 or more and having a glass transition temperature of 60° C. or more.

In this case, as for the monomer B, i.e., at least one monomer selected from the group consisting of the monomers represented by the foregoing formula (I) and the monomers represented by the foregoing formula (II), it is preferred to add the monomer B in an amount of 5 to 30 mol % for the following reasons. That is, when more than 30 mol % of the monomer B is incorporated into a linear polymer to be obtained, there are disadvantages that the polar group content in a cured paint film will be undesirably heightened and because of this, any improvement cannot be attained in its adhesiveness with a substrate, and in addition to this, the resulting cured film will be such that is poor in the water proof. On the other hand, when less than 5 mol % of the monomer B is incorporated into a linear polymer to be obtained, not only the adhesiveness with substrate but also the effects of a paint film as the binder will be insufficient.

In order for the resulting linear polymer to have a high glass transition temperature and to contribute in heightening the water proof for the resulting cured film, among the foregoing monomers C, methylmethacrylate, isobornylmethacrylate, isobornylacrylate, tricyclodecaneacrylate or tricyclodecanemethacrylate is most desired.

The foregoing epoxy resin (iii) which comprises at least one compound having two or more epoxy groups in one molecule in which part of the epoxy groups being esterificated with an unsaturated carboxylic acid (hereinafter referred to as "half-esterificated epoxy resin (iii)") to be used in the resin composition according to this invention is a component which permits the said resin composition to exhibit high sensitivity and satisfactory curability in the presence of the foregoing polymerization initiator (v) with the action of an active energy ray and in addition thereto, imparts better adhesiveness with a substrate, water proof, resistance against chemicals, dimensional stability, etc., to the resulting cured film constituted with the said resin composition, when it is formed by applying the said resin composition in liquid state on a substrate of glass, plastics, ceramics, etc., followed by curing, or when it is used in the form of a dry film adhered on a substrate.

This half-esterificated resin (iii) may be prepared in accordance with any of the conventional methods. For example, an epoxy resin comprising at least one compound having two or more epoxy groups in one molecule is reacted with an unsaturated carboxylic acid in a predetermined amount in the presence of an addition reaction catalyst and a polymerization-inhibitor and in the presence of a solvent or in the absence thereof at a temperature of 80° to 120° C. to thereby esterificate part of the epoxy groups present in the said epoxy resin.

Examples of the above epoxy resin (iii) comprising at least one compound having two or more epoxy groups in one molecule include epoxy resins as represented by the bisphenol A type, novolac type, alicyclic type, or polyfunctional epoxy resins such as bisphenol S, bisphenol F, tetrahydroxyphenylmethane tetraglycidyl ether, resorcinol diglycidyl ether, glycerine triglycidyl ether, pentaerythritol triglycidyl ether, isocyanuric acid triglycidyl ether and epoxyurethane resins represented by the following formula III:

$$\text{CH}_2\text{---CH---CH}_2\text{---O} \left[ \text{R}^4\text{---O---}\overset{\overset{\text{O}}{\|}}{\text{C}}\text{---NH---R}^5\text{---NH---}\overset{\overset{\|}{\text{O}}}{\text{C}}\text{---O---R}^4 \right] \text{---O---CH}_2\text{---CH---CH}_2 \qquad (\text{III})$$

(wherein $R^4$ represents an alkyl group or an oxyalkyl group, $R^5$ represents

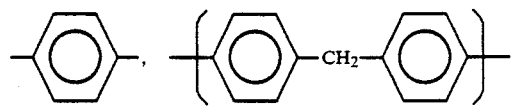

or an alkyl group), and mixtures of two or more of them.

Specific examples of these polyfunctional epoxy resins include those as mentioned in the following. That is, the bisphenol A type epoxy resin may be, for example, Epicoat 828, 834, 871, 1001, 1004 (trade names, produced by Shell Chemical Co.), DER 331-J, 337-J, 661-J, 664-J, 667-J (produced by Dow Chemical Co.), and Epicrone 800 (trade name, produced by Dainippon Ink Kagaku K.K.), etc. The novolac type epoxy resin may be, for example, Epicoat 152, 154, 172 (trade names, produced by Shell Chemical Co.), Allaldite EPN 1138 (trade name, produced by Ciba Geigy Co.), DER 431, 438, and 439 (trade names, produced by Dow Chemical Co.),etc. The alicyclic epoxy resin may be, for example, Araldite CY-175, -176, -179, -182, -184, -192 (trade names, produced by Ciba Geigy Co.), Chissonox 090, 091, 092, 301, 313 (trade names, produced by Chisso K.K.), CYRACURE 6100, 6110, 6200 and ERL 4090, 4617, 2256, 5411 (trade names, produced by Union Carbide Co.) etc. The polyglycidyl ether of aliphatic polyhydric alcohol may be, for example, ethyleneglycol diglycidyl ether, polyethyleneglycol diglycidyl ether, propyleneglycol diglycidyl ether, polypropyleneglycol diglycidyl ether, neopentylglycol diglycidyl ether, 1,6-hexanediol diglycidyl ether, glycerine diglycidyl ether, trymethylolpropane triglycidyl ether, diglycidyl ether of hydrogenated bisphenol A, 2.2-dibromoneopentylglycol diglycidyl ether, etc.; the polyglycidyl ether derived from aromatic polyhydric alcohol may be, for example, diglycidyl ether of an addition product of bisphenol A added with 2 to 16 mols of alkyleneoxide, a diglycidyl ether of an addition product of bisphenol F added with 2 to 16 mols of alkylenoxide, a diglycidyl ether of an addition product of bisphenol S added with 2 to 16 mols of alkyleneoxide.

As the unsaturated carboxylic acid to be used for the esterification of part of the epoxy groups present in the foregoing epoxy resin (this esterification will be hereinafter called "half-esterification"), various unsaturated carboxylic acids may be selectively used.

However, in order to add a desired curability with the action of an active energy ray to the resulting resin composition in this invention, it is desired to use such a monobasic unsaturated carboxylic acid that has at least an acrylic or methacrylic vinyl group on one end of the molecule and a carboxyl group on the other end thereof.

Representative examples of such unsaturated carboxylic acid may include acrylic acid and methacrylic acid, and other than these, a monoester compound obtained by reacting a dicarboxylic acid with a (metha)acrylic acid ester having a hydroxyl group.

As the above dicarboxylic acid, there can be mentioned phthalic acid, isophthalic acid, terephthalic acid, oxalic acid, malonic acid, succinic acid, glutaric acid, adipic acid, pimelic acid, suberic acid, azelaic acid, sebacic acid, isosebacic acid, tetrahydrophthalic acid and anhydrides of these compounds.

As the above methacrylic acid ester having a hydroxyl group, there can be mentioned 2-hydroxypropyl(meth)acrylate, 3-chloro-2-hydroxypropyl(meth)acrylate, 4-hydroxybutyl(meth)acrylate, 3-hydroxybutyl(meth)acrylate, 5-hydroxypentyl(meth)acrylate, 6-hydroxyhexyl(meth)acrylate, etc.

As the addition reaction catalyst to be used in the half-esterification reaction of the foregoing epoxy resin, there can be mentioned metal halides such as zinc chloride or lithium chloride: sulfide compounds such as dimethyl sulfide or methylphenyl sulfide: sulfoxide compounds such as dimethyl sulfoxide or methylethyl sulfoxide: tertiary amine compounds such as N,N-dimethylaniline, pyridine, triethylamine, benzyldimethylamine, hydrochlorides of these amine compounds or oxalates of these amine compounds: tetraammonium salt compounds such as tetramethylammonium chloride, trimethyldodecylbenzylammonium chloride or triethylbenzylammonium chloride: sulfonic acids such as paratoluene sulfonic acid: and mercaptan compounds such as ethyl mercaptan or propyl mercaptan.

As the foregoing polymerization-inhibitor to be used in the half-esterification reaction of the foregoing epoxy resin, there can be mentioned hydroquinone, alkyl- or aryl-substituted hydroquinone, tertiary butyl catechol, pyrogallol, naphthylamine, β-naphthol, cuprous chloride, 2,6-ditertiarybutyl-p-cresol, phenothiazine, N-nitrosodiphenylamine and nitrobenzene.

And as the solvent to be used in the foregoing half-esterification reaction of the foregoing epoxy resin, there can be mentioned toluene, xylene, methyl isobutyl ketone, methyl ethyl ketone, ethyl acetate, butyl acetate, isobutyl acetate, etc.

The amount of the epoxy resin and that of the carboxylic acid to be employed in the half-esterification reaction are properly determined such that the ratio of the epoxy groups in the epoxy resin to the carboxylic groups of the carboxylic acid becomes to lay preferably in the range of from 1:0.3 to 1:0.7, and more preferably, in the range of from 1:0.45 to 1:0.55.

In the case where the ratio of the epoxy groups esterificated with the unsaturated carboxylic acid in a half-esterificated epoxy resin to be prepared is higher than the above range, it is difficult to obtain an objective resin composition curable with an active energy ray which is accompanied with a desired resistance against chemicals and a desired dimensional stability respectively caused by the foegoing epoxy resin (iii). On the other hand, in the case where the aforesaid ratio is lower than the above range, it is also difficult to obtain an objective resin composition curable with an active energy ray which exhibits a high resolution and a sufficient curability respectively based on the methacrylic ester group with the action said energy ray.

The above half-esterificated epoxy resin (iii) has, among others, a high sensitivity and a desired curability to an active energy ray based on the acrylic ester group and a desired heat curability based on the epoxy group.

Because of this, a cured film obtained by curing the active energy ray curing resin composition according to this invention with irradiation of an active energy ray then heating at a temperature of 80° C. or more for a period of 10 minutes to 3 hours becomes such that is accompanied with a desired resistance against chemicals and a desired dimensional stability respectively caused by the half-esterificated epoxy resin (iii).

The foregoing monomer (iv) having an ethylenically unsaturated bond to be used in the resin composition according to this invention is a component for permitting the said composition to exhibit curability with an active energy ray, particularly imparting excellent sensitivity to an active energy ray to the said composition, similarly as the above-mentioned epoxy resin (iii). The said monomer (iv) should preferably have a boiling point of 100° C. or higher under atmospheric pressure, having preferably two or more ethylenically unsaturated bonds, and various known monomers curable by irradiation of an active energy ray can be used.

Specific examples of such monomer having two or more ethylenically unsaturated bonds include (a) acrylic acid esters of methacrylic acid esters of polyfunctional epoxy resins having two or more epoxy groups in one molecule, (b) acrylic acid esters or methacrylic acid esters of alkyleneoxide addition products of polyhydric alcohols, (c) polyester acrylates having acrylic acid ester group at the terminal ends of the molecular chains of polyesters having molecular weights of 500 to 3000 comprising dibasic acid and dihydric alcohol, (d) the reaction products between polyisocyanates and acrylic acid monomers having hydroxyl groups. The above monomers (a)–(d) may be urethane-modified products having urethane bonds in the molecules.

Examples of the monomer belonging to (a) include acrylic acid or methacrylic acid esters of polyfunctional epoxy resins to be used for formation of the foregoing epoxy resin (iii).

Examples of the monomer belonging to (b) include ethyleneglycol di(meth)acrylate, diethyleneglycol di(meth)acrylate, polyethyleneglycol di(meth)acrylate, 1,6-hexanediol di(meth)acrylate, polyethyleneglycol di(meth)acrylate, pentaerythritol tri(meth)acrylate and the like, and those known under the trade names of KAYARD HX-220, HX-620, D-310, D-320, D-330, DPHA, R-604, DPCA-20, DPCA-30, DPCA-60, DPCA 120 (all produced by Nippon Kayaku K.K.), and also those known under the trade names of NK ester BPE-200, BPE-500, BPE-1300, A-BPE-4 (all produced by Shin Nakamura Kagaku K.K.), etc., may also be used.

The monomers belonging to (c) may be exemplified by those known under the trade names of Aronix M-6100, M-6200, M-6250, M-6300, M-6400, M-7100, M-8030, M-8060, M-8100 (all produced by Toa Gosei Kagaku K.K.). Examples of the monomer belonging to (c) and having urethane bonds of polyester include those known under the trade names of Aronix M-1100, Aronix M-1200, (both produced by Toa Gosei Kagaku K.K.).

The monomers belonging to (d) may include the reaction products between polyisocyanate such as tolylene diisocyanate, isophorone diisocyanate, hexamethylene diisocyanate, trimethylhexamethylene diisocyanate, lysine diisocyanate, diphenylmethane diisocyanate or the like with a hydroxyl containing acrylic monomer, and it is possible to use the reaction products having (meth)acrylic acid esters containing hydroxyl group(s) added to polyisocyanate compounds known under the trade names of Sumidule N (buret derivative of hexamethylene diisocyanate), Sumidule L (trimethylolpropane modified product of tolylene diisocyanate) (all produced by Sumitomo Bayer Urethane K.K.), etc. The hydroxyl containing acrylic monomer as herein mentioned may include typically (meth)acrylic acid esters, preferably hydroxyethyl (meth)acrylate, hydroxypropyl (meth)acrylate. It is also possible to use other acrylic monomers containing hydroxyl group(s), particularly those represented by the foregoing formula I to be used for the graft chains in the case of the foregoing graft copolymerized polymer (i).

In addition to the monomers having two or more ethylenically unsaturated bonds as mentioned above, it is also possible to use monomers having only one ethylenically unsaturated bond as mentioned below together with these monomers.

To exemplify such monomers having one ethylenically unsaturated bond, there may be included, for example, carboxyl containing unsaturated monomers such as acrylic acid, methacrylic acid or the like; glycidyl containing unsaturated monomers such as glycidyl acrylate, glycidyl methacrylate or the like; $C_2$-$C_8$ hydroxyalkyl esters of acrylic acid or methacrylic acid such as hydroxyethyl acrylate, hydroxyethyl methacrylate, hydroxypropyl acrylate, hydroxypropyl methacrylate or the like; monoesters of acrylic acid or methacrylic acid with polyethyleneglycol or polypropyleneglycol such as polyethyleneglycol monoacrylate, polyethyleneglycol monomethacrylate, polypropyleneglycol monoacrylate, polypropyleneglycol monomethacrylate or the like; $C_1$-$C_{12}$ alkyl or cycloalkyl esters of acrylic acid or methacrylic acid such as methyl acrylate, ethyl acrylate, propyl acrylate, isopropyl acrylate, butyl acrylate, hexyl acrylate, octyl acrylate, lauryl acrylate, cyclohexyl acrylate, methyl methacrylate, ethyl methacrylate, propyl methacrylate, isopropyl methacrylate, butyl methacrylate, isopropyl methacrylate, butyl methacrylate, hexyl methacrylate, octyl methacrylate, lauryl methacrylate, cyclohexyl methacrylate or the like; other monomers such as styrene, vinyltoluene, methylstyrene, vinyl acetate, vinyl chloride, vinyl isobutyl ether, acrylonitrile, acrylamide, methacrylamide, acrylic acid or methacrylic acid adduct of alkylglycidyl ether, vinylpyrrolidone, dicyclopentenyloxyethyl(meth)acrylate, E-caploractone modified hydroxyalkyl(meth)acrylate, tetrahydrofurfulyl acrylate, phenoxyethyl acrylate; and others.

By use of the above monomer (iv) having ethylenically unsaturated bonds, high sensitivity and satisfactory curability to an active energy ray can be imparted to the resin composition for formation of a resin cured film in this invention.

The foregoing polymerization initiator (v) capable of generating a Lewis acid with irradiation of an active energy ray to be used in the active energy ray curing resin composition according to this invention is a component for curing the half-esterificated epoxy resin (iii) as mentioned above with the action of the Lewis acid, which permits the said resin composition to exhibit a high sensitivity and desired curability to an active energy ray. As such a polymerization initiator (v), there may be preferably used, for example, aromatic onium salt compounds having photosensitivity containing an element belonging to the groups VIa as disclosed in Japanese Patent publication No. 14278/1977 or aromatic onium salt compounds having photosensitivity containing an element belonging to the group Va as shown in Japanese Patent publication No. 14279/1977 or aromatic halonium salts having photosensitivity as shown in Japanese Patent publication No. 147277/1977. These aromatic onium salt compounds or aromatic halonium salts all have the characteristic of curing the half-esterificated epoxy resin (iii) by releasing a Lewis acid with irradiation of an active energy ray.

The aromatic onium salt compounds having photosensitivity of the element belonging to the group VIa or the group Va may include typically the compounds of the following formula IV:

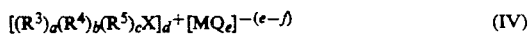

(wherein $R^3$ is a monovalent organic aromatic group, $R^4$ is a monovalent organic aliphatic group selected from alkyl groups, cycloalkyl groups and substituted alkyl groups, $R^5$ is a polyvalent organic group for constituting heterocyclic or fused ring structure selected from aliphatic groups and aromatic groups, X is an element belonging to the group VIa selected from sulfur, selenium and tellurium or an element belonging to the group Va selected from nitrogen, phosphorus, arsenic, antimony and bismuth, M is a metal or metalloid and Q is halogen, a is an integer of 0 to 3 when X is an element belonging to the group VIa or an integer of 0 to 4 when X is an element belonging to the group Va, b is an integer of 0 to 2, c is an integer of 0 or 1 when X is an element belonging to the group VIa or an integer of 0 to 2 when X is an element belonging to the group Va, f is an integer of 2 to 7 representing the valence of M, e is an integer which is greater than f but not more than 8, and the sum of a, b and c is 3 when X is an element belonging to the group VIa or 4 when X is an element belonging to the group Va, and d=e−f).

On the other hand, the photosensitive aromatic halonium salt may be exemplified by the following formula V:

(wherein $R^6$ is a monovalent aromatic organic group, $R^7$ is a divalent aromatic organic group, X is halogen, M is a metal or metalloid and Q is halogen, respectively, g is an integer of 0 or 2 and h is an integer of 0 or 1, with the sum of g and h being equal to 2 or the valence of X, i being equal to k−1, j is an integer of 2 to 7 which is equal to the valence of M, and k is an integer greater than one but up to 8).

Specific examples of the photosensitive aromatic onium salt compounds containing an element belonging to the group VIa or the group Va may include the photosensitive aromatic onium salts of the elements belonging to the group VIa as shown below:

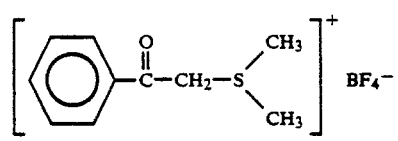

a)

-continued
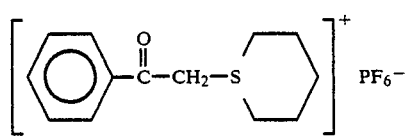 b)
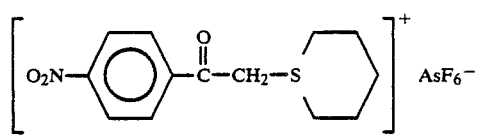 c)
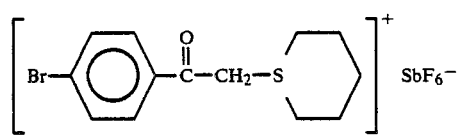 d)
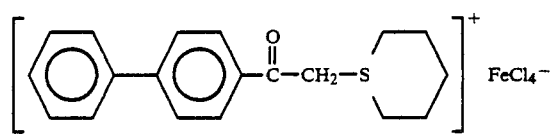 e)
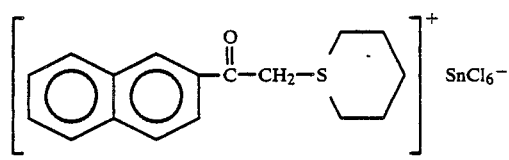 f)
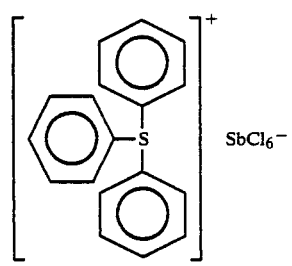 g)
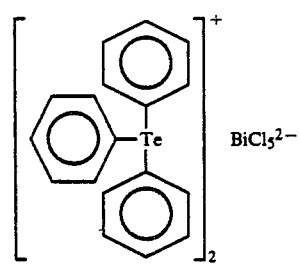 h)
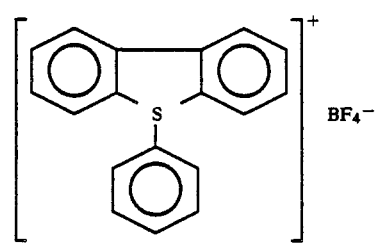 i)
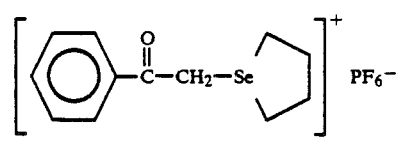 j)

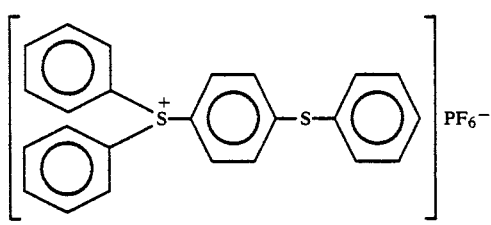 k)
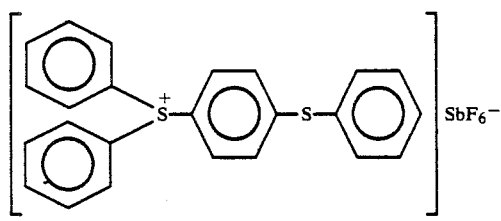 l)
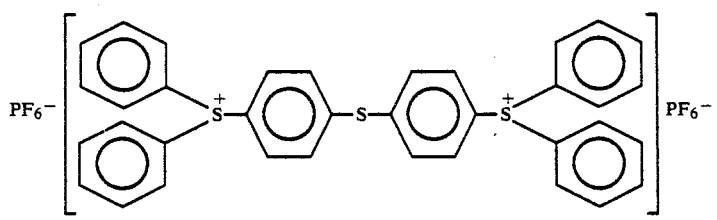 m)
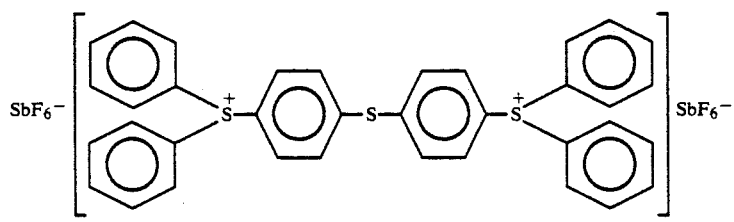 n)
and photosensitive aromatic onium salts of the elements belonging to the group Va as shown below:
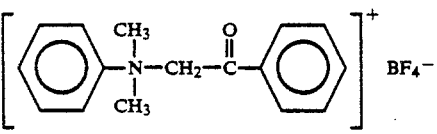 1)
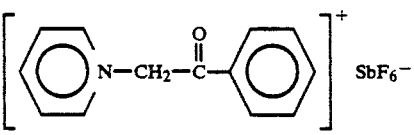 2)
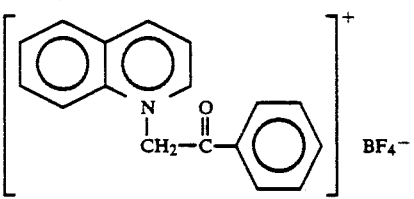 3)
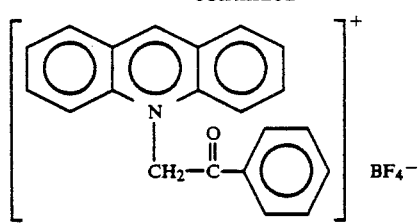 4)
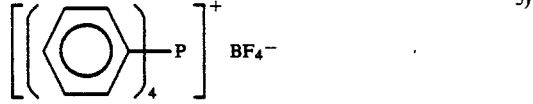 5)
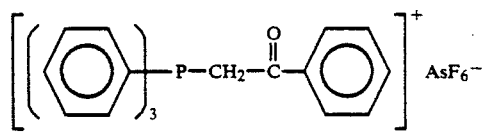 6)
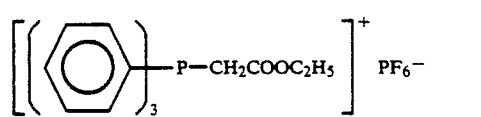 7)

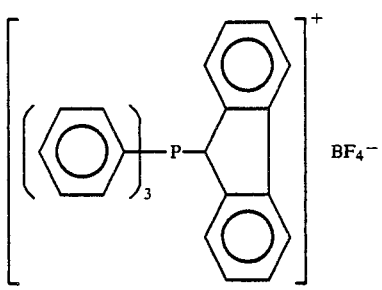

8)

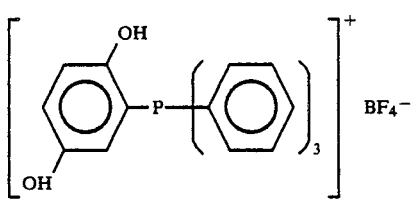

9)

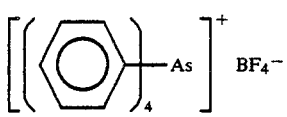

10)

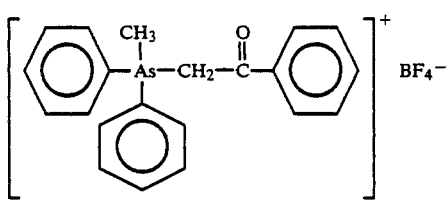

11)

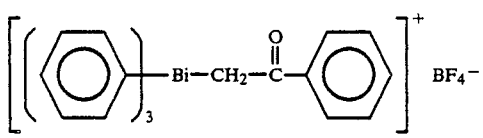

12)

Specific examples of the photosensitive aromatic halonium salts include, for example:

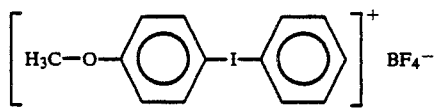

A)

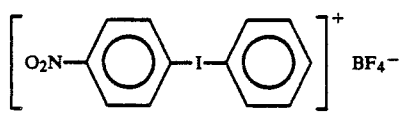

B)

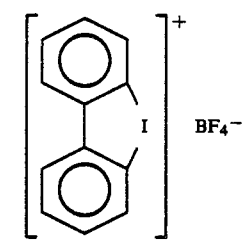

C)

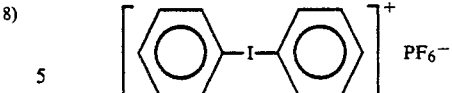

D)

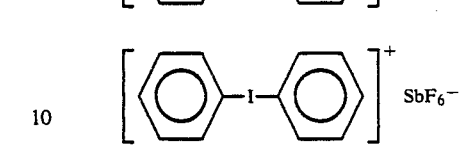

E)

In addition to the above polymerization initiator (v), it is possible to use a proper known hardner selected from polyamines, polyamides, acid anhydrides, boron trifluorideamine complexes, imidazoles, complexes of imidazoles with metal salts, in case where necessary.

The active energy ray-curing resin composition according to this invention is one that is cured with irradiation of an active energy ray. In the case where there are used a graft copolymerized polymer (i) and/or a linear polymer (ii) respectively having photopolymerizability and an active energy ray with a wavelength of 250 nm to 450 nm, it is desired to place a radical polymerization initiator having the properties of being activated with the action of an active energy ray, forming organic free radicals and initiating radical polmerization in the said resin composition.

Specific examples of such radical polymerization initiators include benzyl ether: benzoin alkyl ethers such as benzoin isobutyl ether, benzoin isopropyl ether, benzoin-n-butyl ether, benzoin ethyl ether, benzoin methyl ether and the like; benzophenones such as benzophenone, 4,4'-bis (N,N-diethylamino)benzophenone benzophenone methyl ether and the like; anthraquinones such as 2-ethylanthraquinone, 2-tert-butylanthraquinone and the like; xanthones such as 2,4-dimethylthioxanthone, 2,4-diisopropylthioxathone and the like; acetophenones such as 2,2-dimethoxy-2-phenylacetophenone, α,α-dichloro-4-phenoxyacetophenone, p-tert-butyltrichloroacetophenone, p-tert-butyldichloroacetophenone, 2,2-diethoxyacetophenone, p-dimethylaminoacetophenone and the like; or hydroxycyclohexylphenyl ketone (e.g., Irugacure 184, produced by Ciba Geigy Co.), 1-(4-isopropylphenyl)-2-hydroxy-2-methylpropane-1-on (e.g. Darocure 1116, produced by Merck Co.): 2-hydroxy-2-methyl-1-phenylpropane-1-on (e.g. Darocure 1173, produced by Merck Co.): etc., as preferable ones.

In addition to these radical polymerization initiators, amino compounds may be added as the photopolymerization accelerator.

The amino compounds to be used as the photopolymerization accelerator may include ethanolamine, ethyl-4-dimethylaminobenzoate, 2-(dimethylamino)ethylbenzoate, p-dimethylaminobenzoic acid n-amylester, p-dimethylaminobenzoic acid isoamyl ester, etc.

The constitutional ratios of the foregoing graft copolymerized polymer (i), linear polymer (ii), half-esterificated epoxy resin (iii), monomer (iv) and polymerization initiator (v) for the active energy ray-curing resin composition according to this invention are properly determined upon the application purpose.

In a preferred embodiment, the weight ratio of the graft copolymerized polymer (i) to the linear polymer (ii) is desired to be such that (i):(ii) is in the range of from 80:20 to 50:50 in parts by weight.

This situation is an important factor for the active energy ray-curing resin composition according to this invention to exhibit a desired adhesiveness to a substrate based on the graft copolymerized polymer (i) and a desired patterning property based on the linear polymer (ii).

In addition to the above, the weight ratio of the sum amount of the graft copolymerized polymer (i) and the linear polymer (ii) to that of the half-esterificated epoxy resin (iii) and the monomer (iv) is desired to be such that [(i)+(ii)]:[(iii)+(iv)] is in the range of from 100:50 to 100:200 in parts by weight. And the weight ratio of the half-esterificated epoxy resin (iii) to the monomer (iv) is desired to be such that (iii):(iv) is in the range of from 25:75 to 75:25.

Further, the weight ratio of the sum amount of the graft copolymerized polymer (i), the linear polymer (ii), the half-esterificated epoxy resin (iii) and the monomer (iv) to the polymerization initiator (v) is desired to be such that [(i)+(ii)+(iii)+(iv)]:(v) is in the range of from 100:1 to 100:10 in parts by weight.

In the case where the foregoing photopolymerization accelerator (iv) or/and the foregoing radical polymerization intiator (vii) is used in addition to the polymerization initiator (v), the weight ratio of the sum amount of the above (i), (ii), (iii) and (iv) to the above (vi) or (vii) or the sum amount of them is desired to be such that [(i)+(ii)+(iii)+(iv)]:(vi) or (vii) or [(vi)+(vii)] is in the range of from 100:1 to 100:10 in parts by weight.

The active energy ray-curing resin composition according to this invention may further contain additives such as catalysts for condensation crosslinking, heat polymerization inhibitors, colorants such as dyes and pigments, fillers, heat stabilizers such as hydroquinone or paramethoxyphenol, adhesion promotors, plasticizers, extender pigments such as silica or talc, leveling agents of imparting coating suitability, etc., if desired.

The condensation crosslinking catalyst may include sulfonic acids, typically p-toluenesulfonic acid, carboxylic acids such as formic acid, etc. The heat polymerization inhibitor may include hydroquinone and derivatives thereof, p-methoxyphenol, phenothiazine, etc. As the colorant, there can be added oil-soluble dyes and pigments within the range which do not substantially prevent transmission of the active energy ray. As the filler, for enhancement of hardness of coating, as well as for enhancement of coloration, adhesion, mechanical strength, there may be employed extender pigments, plastic fine particles, etc., which are used in coating materials in general. As the adhesion promotor, silane coupling agents, low molecular surfactants as inorganic surface modifiers may be effectively used.

As the solvent to be used when employing the active energy ray-curing resin composition for formation of a resin cured film in the form of a liquid or when coating the composition on a plastic film which is a film substrate in formation of a dry film, hydrophilic solvents such as alcohols, glycol ethers, glycol esters, etc., may be employed. Of course, it is also possible to use mixtures comprising these hydrophilic solvents as the main component, mixed optionally at appropriate proportions with ketones such as methyl ethyl ketone, methyl isobutyl ketone, etc., esters such as ethyl acetate, isobutyl acetate, etc., aromatic hydrocarbons such as toluene, xylene, etc., and their halogen derivatives, aliphatic solvents containing chlorine such as methylene chloride, 1,1,1-trichloroethane, etc. These solvents can be also used as the developer for the resin composition after patterning.

The active energy ray-curing resin composition according to this invention as explained above may be applied onto a substrate in accordance with any of the conventional methods. Specific examples of such method will be below illustrated:

(1) In the case of forming a cured film coat on a substrate, the active energy ray-curing resin composition is liquid state is applied onto the substrate to form a liquid coat thereon which is followed by evaporation to dryness, then the resultant dried coat is cured by irradiating it with an active energy.

(2) In the case of forming a protective cured layer in the form of a desired pattern on a substrate, the active energy ray-curing resin composition in liquid state is applied onto the substrate to form a liquid coat thereon which is followed by evaporation to dryness, the resultant dry layer is scanned with laser beam in a desired pattern, and the unexposed portion is etched off with a proper solvent such as 1,1,1-trichloroethane to thereby form a protective cured layer in the form of a desired pattern on the substrate.

(3) In the case of forming a protective cured layer coat in the form of a desired pattern on a substrate, the active energy ray-curing resin composition in liquid state is applied onto the substrate to form a liquid coat thereon which is followed by evaporation to dryness, a photomask having a pattern with a desired shape which does not transmit any active energy ray is superposed on the resultant dry film layer, then exposure with an active energy ray is effected from above the photomask, and the unexposed portion is removed by a proper solvent such as 1,1,1-trichloroethane to thereby form a protective cured layer in the form of a desired pattern on the substrate.

(4) In the case of forming a photosensitive dry film and laminating said dry film on a substrate, the active energy ray-curing resin composition in liquid state is applied onto a polyethylene terephthalate film to form a liquid coat thereon which is followed by evaporation dryness, whereby obtaining a photosensitive dry film on the said polyethylene terephthalate film, the resultant is laminate onto a substrate in accordance with the conventional lamination method to obtain a laminate, and the photosensitive dry film as laminated on the substrate is cured by irradiating it with an active energy ray in the same way as in the above method (1).

If the resulting cured photosensitive film is desired to have been shaped in a desired pattern, the above dry film as laminated on the substrate is treated in the same way as the above method (2) or (3).

In the case where the active energy ray-curing resin composition is one that contains the monomer represented by the foregoing formula (1), the cured film as obtained in any of the above methods (1) to (4) is desired to be further subjected to heat-treatment at a temperature of 80° C. to 200° C. to thereby condensedly cure it.

The active energy ray to be used for curing the active energy ray-curing resin composition of this invention or for the pattern exposure may include ultraviolet rays (UV-rays) or electron beams which have widely been practically applied. As the UV-ray light source, there may be employed high pressure mercury lamps, ultra-high pressure mercury lamps, metal halide lamps, etc., enriched in light with wavelength of 250 nm to 450 nm, preferably those which can give a light intensity of about 1 mW/cm² to 100 mW/cm² at the wavelength in the vicinity of 365 nm at a distance between the lamp and the material to be irradiated which is practically permissible. The electron beam irradiation device is not particularly limited, but a device having a dose within the range of 0.5 to 20 M Rad is practically suitable.

PREFERRED EMBODIMENT OF THE INVENTION

The advantages of this invention are now described in more detail by reference to the following Examples, which are provided merely for illustrative purposes only, and are not intended to limit the scope of this invention.

EXAMPLE 1

1. Provision of each of the components (i) to (v) for the preparation of a active energy ray-curing resin composition of this invention Preparation of a graft copolymerized polymer (i)

Radical chain transfer polymerization of 80 parts by weight of 2-hydroxyethylmethacrylate and 20 parts by weight of butylacrylate was carried out using thioglycollic acid as the chain transferring agent and azobisisobutyronitrile as the polymerization initiator to obtain an oligomer having a carboxyl group at the terminal end of the molecular chain.

This oligomer was reacted with glycidylmethacrylate to obtain a macromonomer having a methacryloyl group at one terminal end of the molecular chain. The result of the measurement by the known GPC method gave a value of about 3,000 for the number average molecular weight of the resultant macromonomer.

Solution polymerization of 30 parts by weight of the said macromonomer and 70 parts by weight of methylmethacrylate was carried out in methyl cellosolve solvent to thereby obtain a graft copolymerized polymer having a weight average molecular weight of about 50,000 and a number average molecular weight of about 12,000.

A linear polymer (ii)

There was provided a linear acrylic polymer obtained by polymerizing methylmethacrylate, isobornylmethacrylate and 2-hydroxyethylacrylate in the molar ratio of 70:20:10. This linear acrylic polymer is one that has a number average molecular weight of about 70,000 and a weight average molecular weight of about 250,000.

A half-esterificated epoxy resin (iii)

There was provided a 50% acrylic ester of Epicoat 828 (trade name, produced by Yuka Shellepoxy K.K.)(epoxy resin of bisphenol A type: epoxy equivalent of 183–193)

A monomer having an ethylenically unsaturated bond (iv)

There were provided the following two kinds of monoers (iv)-(1) and (iv)-(2):

(iv)-(1): 2-hydroxyethylacrylate adduct to diphenylmethanediisocyanate (iv)-(2): trimethylolpropanetriacrylate A polymerization initiator (v)

There were provided the following two polymerization initiators (v)-(1) and (v)-(2):

(v)-(1): the foregoing photosensitive aromatic onium salt (n)

(v)-(2): IRUGACURE 651 (trade name, produced by Ciba Geigy Co.)[photopolymerization initiator of the monomer (iv)]

2. Preparation of an active energy ray-curing resin composition of this invention The above components (i) to (v)-(2) were well mixed by the weight ratios as below shown in accordance with the conventional mixing technique to thereby obtain the active energy ray-curing resin composition, in which there were used the additives as below shown.

| Component | Parts by weight |
|---|---|
| (i) | 50 |
| (ii) | 50 |
| (iii) | 50 |
| (iv)-(1) | 70 |
| (iv)-(2) | 20 |
| (v)-(1) | 7.5 |
| (v)-(2) | 2.5 |
| Methylene Blue | 1 |
| methyl cellosolve | 250 |
| methylethyl ketone | 100 |

3. Preparation of a resin cured film

The thus obtained active energy ray-curing resin composition in liquid state was applied onto the cleaned surface of a glass plate to form a liquid coat of about 80 μm in thickness, followed by air-dryness at 100° C. for 15 minutes to obtain a dry film of about 40 μm on the glass plate.

The glass plate having said dry film thereon was exposed to active energy rays with maximum irradiation energy of 100 mW/cm² from the conventional ultra-high pressure mercury lamp for 10 seconds. Thereafter, it was heat-treated at 150° C. for 30 minutes. The resultant was subjected to reflux treatment in 1% caustic soda aqueous solution for 10 hours.

The thus obtained laminate was tested and as a result, it was found that the exposed (cured) resin film is firmly adhered to the glass plate, and there were not observed any chloroisis or bulging phenomena on the resultant film even after storage for a long period of time.

EXAMPLE 2

The active energy ray-curing resin composition obtained in Example 1 was applied onto the cleaned surface of a glass plate to form a liquid coat, followed by air-dryness to obtain a dry film of about 50 μm in thickness in the same way as in Example 1.

Subsequently, on the dry film laminated on the glass plate, a glass mask having a group comprising a plurality of lines being arranged with an equal space in which the minimum size being 20 μm in line/width and 20 μm in space was superposed, and the dry film was exposed to UV-ray using a UV-ray irradiation device of generating collimated UV-ray (trade name: Mask aligner-MA-10, produced by Mikasa Kabushiki Kaisha). After exposure for a certain period of time, it was spray-developed using 1,1,1-trichloroethane.

In this way, there were three different group samples (Sample Groups I to III) with three different exposure energies i.e. 80 mJ/cm², 100 mJ/cm² and 120 mJ/cm².

In each of the Sample Groups I to III, there were prepared three different samples with different developing periods of time i.e. 30 seconds, 60 seconds and 90 seconds.

For the comparison purpose, the procedures of Example 1 for the preparation of the active energy ray-curing resin composition were repeated, except that the amount of the graft copolymerized polymer (i) was changed to 100 parts by weight and there was not used the linear polymer (ii), to thereby obtain a comparative resin composition.

And, using this comparative resin composition, there were prepared Comparative Sample Group I to III samples by repeating the above procedures.

The samples thus obtained were evaluated by the conventional evaluation method with respect to pattern resolution, residual undeveloped portion and pattern swelling.

The evaluation results were as shown in the following Table.

TABLE

|  |  | 30 seconds | 60 seconds | 90 seconds |
|---|---|---|---|---|
| 80 mJ/cm$^2$ | Sample Group I | O | O | O |
|  | Comparative Sample Group I | x | O | x |
| 100 mJ/cm$^2$ | Sample Group II | O | O | O |
|  | Comparative Sample Group II | x | O | O |
| 120 mJ/cm$^2$ | Sample Group III | O | O | O |
|  | Comparative Sample Group III | x | x | O |

Note:
O: pattern is well resolved, and neither residual undeveloped portion nor pattern swelling are observed.
x: residual undeveloped portion or/and pattern swelling is observed.

As Table illustrates, it is understood that the active energy ray-curing resin composition of this invention is always stable without depending upon exposure conditions and developing conditions.

EXAMPLE 3

1. Provision of each of the components (i) to (v) for the preparation of an active energy ray-curing resin composition of this invention Preparation of a graft copolymerized polymer (i)

The procedures for the preparation of the macromonomer in Example 1 were repeated, except that there were used 50 parts by weight of 2-hydroxyethylmethacrylate and 50 parts by weight of butoxymethylacrylamide, to thereby obtain a macromonomer having a methacryloyl group at one terminal end of the molecular chain.

The result of the measurement by the known GPC method gave a value of about 2,000 for the number average molecular weight of the resultant macromonomer.

Solution polymerization of 20 parts by weight of the said macromonomer and 80 parts by weight of methylmethacrylate was carried out in a solvent containing methyl cellosolve and methylethy ketone by the weight ratio of 60:40 to thereby obtain a thermosetting graft copolymerized polymer having a number average molecular weight of about 5,000 and a weight average molecular weight of about 30,000.

A linear polymer (ii)

There was provided a linear acrylic copolymer obtained by polymerizing methylmethacrylate, tricyclodecanmethacrylate and butoxymethylacrylamide in the molar ratio of 60:30:10. This linear acrylic copolymer is one that has a number average molecular weight of about 60,000 and a weight average molecular weight of about 260,000.

A half-esterificated epoxy resin (iii)

There was provided a 100 % acrylic ester of phenol novolac type epoxy resin (condensation degree: 3-4).

A monomer having an ethylenically unsaturated bond (iv)

There were provided the following two kinds of monomers (iv)-(1) and (iv)-(2):
  (iv)-(1) 100 % acrylic ester of an epoxy resin of phenol novolak type (condensation degree: 3-4)
  (iv)-(2): neopentylglycoldiacrylate A polymerization initiator (v)

There were provided the following two polymerization initiators (v)-(1) and (v)-(2):
  (v)-(1): the foregoing photosensitive aromatic onium salt (1) (trade name: UVE-1014, produced by General Electric Co., Ltd.)
  (v)-(2): DAROCURE 1173 (trade name, produced by MERICK Co.)[photopolymerization initiator of the monomer (iv)]

2. Preparation of an active energy ray-curing resin composition of this invention The above components (i) to (v)-(2) were well mixed by the weight ratios as below shown in accordance with the conventional mixing technique to thereby obtain the active energy ray-curing resin composition, in which there were used the additives as below shown.

| Component | Parts by weight |
|---|---|
| (i) | 80 |
| (ii) | 20 |
| (iii) | 100 |
| (iv)-(1) | 60 |
| (iv)-(2) | 40 |
| (v)-(1) | 8.5 |
| (v)-(2) | 2.5 |
| Methylene Blue | 1 |
| methyl cellosolve | 200 |
| methylethyl ketone | 100 |

3. Preparation of a protective resin cured film on a printed board

On a printed board comprising conductor circuit composed of 60 μm thick copper foil formed on a glass cross epoxy resin substrate, there was formed a liquid coat of the thickness to be 50 μm when dried by applying the resin composition in liquid state obtained in the above step 2 by way of the conventional roll coater. The liquid coat was then air-dried at 100° C. for 3 minutes.

After cooling, a solder mask pattern was superposed on the dry film and subjected to pattern exposure for 35 seconds using the conventional ultra-high pressure mercury lamp of generating collimated UV ray, the luminous flux density of the UV ray from which is to be 7 mW/cm$^2$ near 365 nm and the collimation amplitude is to be 3°. After completion of the exposure, the resultant was engaged in spray-development with 1,1,1-trichloroethane at 20° C. for 50 seconds. The development was stably proceeded and as a result, there was formed a clear pattern. After completion of the development, the cured dry film on the printed board was air-dried and further irradiated with UV ray from the above mercury lamp for 5 minutes, followed by heat-treatment at 150° C. for 15 minutes to thereby complete the formation of a patterned resin cured protective film on the printed board.

As a result of examining the resultant protective film, it was found that the film is excellent in the resistance against not only acids but also alkalis and also in the resistance against other chemicals.

What we claim is:

1. A resin composition curable with an active energy ray comprising:

(i) a graft copolymerized polymer having a number average molecular weight of 5,000 or more and a weight average molecular weight of 50,000 or less which comprises a trunk chain composed mainly of structural units derived from at least one monomer selected from the group consisting of alkyl methacrylates, acrylonitrile and styrene and has graft chains having structural units derived from at least one monomer selected from the group consisting of the monomers represented by the following formula I and other monomers presented by the formula II:

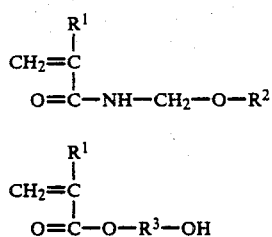

(wherein $R^1$ is hydrogen or an alkyl or hydroxyalkyl group having 1 to 3 carbon atoms, $R^2$ is hydrogen or an alkyl or acyl group having 1 to 4 carbon atoms which may have hydroxy group, $R^3$ is an alkyl group having 2 to 6 carbon atoms, a halogen-substituted alkyl group having 2 to 6 carbon atoms, an alkylether group represented by the formula:

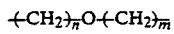

(wherein $2 \leq m+n \leq 6$, $n \neq 0$ and $m \neq 0$), or a phenylalkyl group represented by the formula:

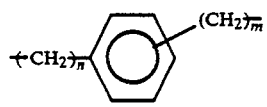

(wherein $2 \leq m+n \leq 4$, or the case where $n=0$ or $m=0$ is contained), added to said trunk chain;

(ii) a linear polymer having a number average molecular weight of 50,000 or more and a weight average molecular weight of 350,000 or less and having a glass transition temperature of 60° C. or more which comprises structural units derived from at least one monomer selected from the group consisting of methyl methacrylate, ethyl methacrylate, isobutyl methacrylate, t-butyl methacrylate, benzyl methacrylate, acrylonitile, isobornyl methacrylate, isobornyl acrylate, tricyclodecaneacrylate, tricyclodecane methacrylate, tricyclodecaneoxyethyl methacrylate, styrene, dimethylaminoethyl methacrylate and cyclohexyl methacrylate and other structural units derived from at least one monomer in amounts from 5 to 30 mole percent selected from the group consisting of the monomers represented by said formula (I) and the monomers represented by said formula (II);

(iii) an epoxy resin comprising at least one compound having two or more epoxy groups in one molecule in which part of the epoxy groups being esterificated with an unsaturated carboxylic acid; and (iv) a monomer having an ethylenically unsaturated bond; and (v) a polymerization initiator capable of generating a Lewis acid by irradiation of an active energy ray.

2. The resin composition according to claim 1, wherein the weight ratio of said graft copolymerized polymer (i) to said linear polymer (ii) is such that (i):(ii) is in the range of from 80:20 to 50:50.

3. The resin composition according to claim 1 or claim 2, wherein the weight ratio of the sum of said graft copolymerized polymer (i) and said linear polymer (ii) to the sum of said epoxy resin (iii) and said monomer (iv) is such that [(i)+(ii)]: [(iii)+(iv)] is in the range of from 100:50 to 100:200.

4. The resin composition according to claim 3, wherein the weight ratio of said epoxy resin (iii) to said monomer (iv) is such that (iii):(iv) is in the range of from 25:75 to 75:25.

5. The resin composition according to claim 1, wherein the weight ratio of the sum of said graft copolymerized polymer (i), said epoxy resin (ii), said epoxy resin (iii) and said monomer (iv) to said polymerization initiator (v) is such that [(i)+(ii)+(iii)+(iv)]:(v) is in the range of from 100:1 to 100:10.

6. The resin composition according to claim 1, wherein said polymerization initiator (v) comprises an aromatic halonium salt compound or an aromatic onium salt compound having photosensitivity containing an element belonging to group VIa or group Va, of the periodic table.

7. The resin composition according to claim 1, wherein the said resin composition contains said polymerization initiator (v) in an amount of 1 to 10 parts by weight versus the amount of 100 parts by weight for the sum of said graft copolymerized polymer (i), said linear polymer (ii), said epoxy resin (iii) and said monomer (iv).

* * * * *

UNITED STATES PATENT AND TRADEMARK OFFICE
CERTIFICATE OF CORRECTION

PATENT NO. : 5,068,257
DATED : November 26, 1991
INVENTOR(S) : HIROMICHI NOGUCHI It is certified that error appears in the above-indentified patent and that said Letters Patent is hereby corrected as shown below:

COLUMN 1

Line 56, "Laid open" should read --Laid-open--.

COLUMN 6

Line 34, "trymethylolpropane" should read --trimethylolpropane--.
    Line 41, "alkylenoxide" should read --alkyleneoxide--.

COLUMN 7

Line 44, "becomes to lay" should read --lies--.
    Line 54, "foegoing" should read --foregoing--.

COLUMN 8

Line 42, "KAYARD" should read --KAYARAD--.
    Line 55, "M-1100," should read --M-1100 and--.
    Line 56, "M-1200," should read --M-1200--.

COLUMN 9

Line 44, "E-caploractone modified" should read --ε-caprolactone-modified--.

COLUMN 10

Line 9, "147277/1977." should read --14277/1977.--.

UNITED STATES PATENT AND TRADEMARK OFFICE
CERTIFICATE OF CORRECTION

PATENT NO. : 5,068,257
DATED : November 26, 1991
INVENTOR(S) : HIROMICHI NOGUCHI It is certified that error appears in the above-indentified patent and that said Letters Patent is hereby corrected as shown below:

COLUMN 16

Line 14, "hardner" should read --hardener--.
    Line 31, "ether:" should read --ether;--.
    Line 48, "Co.):" should read --Co.);--.
    Line 49, "Co.):" should read --Co.);--.

COLUMN 18

Line 9, "is" should read --in--.
    Line 44, "laminate" should read --laminated--.

COLUMN 19

Line 19, "a" should read --an--.
    Line 59, "monoers" should read --monomers--.

COLUMN 21

Line 57, "methylethy" should read --methylethyl--.
    Line 66, "clodecanmethacrylate" should read
            --clodecanemethacrylate--.

COLUMN 22

Line 11, "novolak" should read --novolac--.
    Line 20, "MERICK" should read --MERCK--.

COLUMN 23

Line 7, "we" should read --I--.

UNITED STATES PATENT AND TRADEMARK OFFICE
CERTIFICATE OF CORRECTION

PATENT NO. : 5,068,257
DATED : November 26, 1991
INVENTOR(S) : HIROMICHI NOGUCHI It is certified that error appears in the above-indentified patent and that said Letters Patent is hereby corrected as shown below:

COLUMN 24

Line 5, "acrylonitile" should read --acrylonitrile--.
Line 18, "and" should be deleted.
Line 20, "(v)" should read --¶ (v)--.
Line 40, "epoxy resin (ii)," should read
 --linear polymer (ii),--.

Signed and Sealed this

Second Day of November, 1993

Attest:

BRUCE LEHMAN

Attesting Officer

Commissioner of Patents and Trademarks